(12) United States Patent
Sekiya et al.

(10) Patent No.: US 12,140,642 B2
(45) Date of Patent: Nov. 12, 2024

(54) METHOD FOR EVALUATING ELECTRIC POWER STORAGE DEVICE AND METHOD FOR MANUFACTURING ELECTRIC POWER STORAGE DEVICE

(71) Applicants: TOYOTA JIDOSHA KABUSHIKI KAISHA, Toyota Aichi-ken (JP); JINNAI INDUSTRIES INC., Toyota Aichi-ken (JP)

(72) Inventors: Tomohiro Sekiya, Toyota Aichi-ken (JP); Kensaku Miyazawa, Toyota Aichi-ken (JP); Kazuo Tojima, Toyota Aichi-ken (JP); Hitoshi Nakamura, Toyota Aichi-ken (JP); Haruyoshi Sakakibara, Toyota Aichi-ken (JP); Yasutaka Terashima, Toyota Aichi-ken (JP)

(73) Assignees: TOYOTA JIDOSHA KABUSHIKI KAISHA, Toyota Aichi-ken (JP); JINNAI INDUSTRIES INC., Toyota Aichi-ken (JP)

( * ) Notice: Subject to any disclaimer, the term of this patent is extended or adjusted under 35 U.S.C. 154(b) by 100 days.

(21) Appl. No.: 17/894,715

(22) Filed: Aug. 24, 2022

(65) Prior Publication Data
US 2023/0148028 A1 May 11, 2023

(30) Foreign Application Priority Data
Nov. 9, 2021 (JP) .................................. 2021-182694

(51) Int. Cl.
*G01R 31/52* (2020.01)
*G01R 31/385* (2019.01)

(52) U.S. Cl.
CPC ......... *G01R 31/52* (2020.01); *G01R 31/3865* (2019.01)

(58) Field of Classification Search
CPC ......... G01R 31/36–388; G01R 31/386; H01M 10/4285
See application file for complete search history.

(56) References Cited

U.S. PATENT DOCUMENTS 1,035,175 A * 8/1912 Farkas ..................... G01F 23/58
73/315
1,602,741 A * 10/1926 Beck ....................... G01F 23/04
33/717

(Continued)

FOREIGN PATENT DOCUMENTS

JP 2019-102169 A 6/2019
JP 2019-114506 A 7/2019

(Continued)

*Primary Examiner* — Lee E Rodak
*Assistant Examiner* — Demetrius R Pretlow
(74) *Attorney, Agent, or Firm* — Dinsmore & Shohl LLP

(57) ABSTRACT

A method for evaluating an electric power storage device includes causing a short circuit by inserting an electrically conductive probe into a stacked portion in a thickness direction of electrode layers; measuring a penetration depth of the probe after the short circuit occurs; and evaluating the number of electrode layers involved in the short circuit based on the penetration depth. The penetration depth is identified by measuring a length of an adhesion portion in an axial direction of the probe. The adhesion portion is a portion of a surface of the probe to which a constituent material of the stacked portion adheres.

8 Claims, 9 Drawing Sheets

(56) References Cited

U.S. PATENT DOCUMENTS

| | | | | |
|---|---|---|---|---|
| 6,981,335 | B1* | 1/2006 | Darden | G01F 23/04 |
| | | | | 33/722 |
| 7,968,221 | B2* | 6/2011 | Hatanaka | H01M 10/052 |
| | | | | 429/211 |
| 8,471,566 | B2* | 6/2013 | Nishino | H01M 10/425 |
| | | | | 324/426 |
| 10,718,816 | B2* | 7/2020 | Ishihara | G01R 31/3646 |
| 2009/0139301 | A1* | 6/2009 | Gunsay | G01N 33/246 |
| | | | | 73/1.73 |
| 2009/0176147 | A1* | 7/2009 | Hatanaka | H01M 4/70 |
| | | | | 429/142 |
| 2011/0068800 | A1* | 3/2011 | Nishino | H01M 10/425 |
| | | | | 324/426 |
| 2014/0212703 | A1* | 7/2014 | Kobori | H01M 4/583 |
| | | | | 252/182.1 |
| 2019/0162771 | A1* | 5/2019 | Miyazawa | H02J 7/0069 |
| 2019/0195959 | A1 | 6/2019 | Ishihara et al. | |
| 2019/0245190 | A1* | 8/2019 | Watanabe | H01M 50/534 |

FOREIGN PATENT DOCUMENTS

| | | |
|---|---|---|
| JP | 2021-044246 A | 3/2021 |
| JP | 2021-185587 A | 12/2021 |

* cited by examiner

METHOD FOR EVALUATING ELECTRIC POWER STORAGE DEVICE AND METHOD FOR MANUFACTURING ELECTRIC POWER STORAGE DEVICE

CROSS-REFERENCE TO RELATED APPLICATION

This application claims priority to Japanese Patent Application No. 2021-182694 filed on Nov. 9, 2021, incorporated herein by reference in its entirety.

BACKGROUND

1. Technical Field

The present disclosure relates to a method for evaluating an electric power storage device and a method for manufacturing an electric power storage device.

2. Description of Related Art

Japanese Unexamined Patent Application Publication No. 2019-102169 (JP 2019-102169 A) discloses a method for evaluating an electric power storage device.

SUMMARY

Foreign matter may enter an electric power storage device (e.g., battery) during the manufacturing process of the electric power storage device. Foreign matter can be, for example, a piece of metal. Foreign matter can be electrically conductive.

Electrically conductive foreign matter is thought to cause a single-layer short circuit. The "single-layer short circuit" signifies an internal short circuit between a single positive electrode layer and a single negative electrode layer. There is a demand for a method in which a single-layer short circuit is artificially caused and the state of an electric power storage device at that time is evaluated. Hereinafter, the positive electrode layer and the negative electrode layer are sometimes collectively referred to as "electrode layers."

A method is conventionally proposed in which a single-layer short circuit is artificially caused by inserting a nail into an electric power storage device. A short circuit can be detected by a change in potential. However, the electrode layers are generally very thin. Even if the nail is stopped after detection of a change in potential, a short circuit involving more electrode layers than in a single-layer short circuit may occur. Therefore, it is sometimes required to disassemble the electric power storage device and to determine (i.e., verify) the number of electrode layers actually involved in the short circuit (hereinafter also referred to as the "number of short-circuited layers") after testing. It takes time and effort to disassemble an electric power storage device. There is also a possibility that accurate evaluation cannot be made due to deformation of the short-circuited portion (hole) that is caused during, for example, removal of the nail or disassembly of the electric power storage device.

The present disclosure provides a method for evaluating the number of short-circuited layers in a simple manner.

Hereinafter, the technical configurations and functions and effects of the present disclosure will be described. However, the mechanism of action of the present specification includes estimation. The mechanism of action does not limit the technical scope of the present disclosure.

In a method for evaluating an electric power storage device according to a first aspect of the disclosure, the electric power storage device including a stacked portion is evaluated. Separator layers and electrode layers are alternately stacked in the stacked portion. The method includes causing a short circuit by inserting an electrically conductive probe into the stacked portion in a thickness direction of the electrode layers; measuring a penetration depth of the probe after the short circuit occurs; and evaluating the number of the electrode layers involved in the short circuit based on the penetration depth. The penetration depth is identified by measuring a length of an adhesion portion in an axial direction of the probe. The adhesion portion is a portion of a surface of the probe to which a constituent material of the stacked portion adheres.

The probe is electrically conductive. When a short circuit occurs through the probe, a current flows through the probe. As a result, Joule heat is generated. A portion of the constituent material of the stacked portion can melt due to the Joule heat. For example, a resin material included in the separator layer can melt. The melted material can adhere to the surface of the probe. It is considered that the length of the portion to which the material adheres (adhesion portion) corresponds to the penetration depth of the probe in the stacked portion at the time when the short circuit occurs. The number of short-circuited layers can be obtained from a thickness of each of the separator layers and a thickness of each of the electrode layers, and the penetration depth. That is, the number of short-circuited layers can be determined without disassembling the electric power storage device.

Evaluating the number of the electrode layers may include determining that the number of the electrode layers involved in the short circuit is two by comparing a thickness of each of the separator layers and a thickness of each of the electrode layers with the penetration depth.

The fact that the number of electrode layers involved in the short circuit is two indicates that a single positive electrode layer and a single negative electrode layer are short-circuited. That is, it indicates establishment of a "single-layer short circuit."

For example, in the case where the probe can pass through the separator layer, the electrode layer (negative electrode layer), the separator layer, and the electrode layer (positive electrode layer) in this order in the outermost layer of the stacked portion, it can be determined that the short circuit is a single-layer short circuit when the penetration depth is smaller than the total thickness of the two separator layers, the negative electrode layer, and the positive electrode layer.

Measuring the penetration depth of the probe may include measuring the length of the adhesion portion in an elemental mapping image of the probe.

When the composition (constituent elements) of the adhering material is different from the composition of the probe, the length of the adhering portion can be measured with high accuracy in the elemental mapping image of the probe.

The constituent material of the stacked portion may be, for example, a resin material included in the separator layers.

For example, when each of the separator layers is a porous resin film, the resin material can melt due to the Joule heat generated by the short circuit. The melted resin material can adhere to the probe.

A method for manufacturing an electric power storage device according to a second aspect of the disclosure includes manufacturing a plurality of electric power storage devices; and evaluating one or more of the electric power storage devices by the method according to the first aspect of the disclosure.

The method for evaluating an electric power storage device may be used for, for example, sampling inspection during manufacturing. The method for evaluating an electric power storage device may be used to, for example, examine specifications in a development stage.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Definition of Terms Etc

Figure 1:
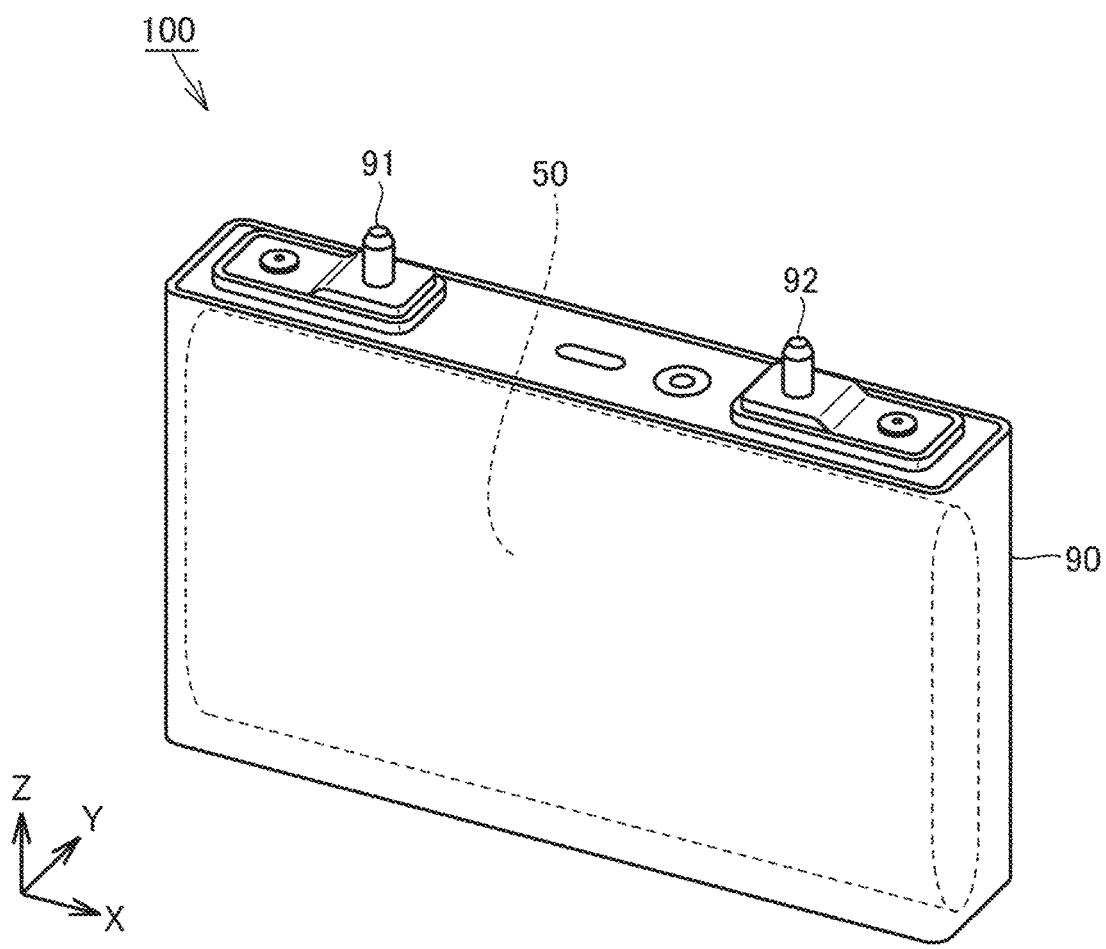
FIG. 1 is a schematic view showing an example of an electric power storage device according to an embodiment.

An embodiment of the present disclosure (hereinafter sometimes simply referred to as "present embodiment") will be described. The present embodiment does not limit the technical scope of the present disclosure.

In the present disclosure, the terms "comprise," "include," "have," and variations thereof (e.g., "constituted by") are open-ended terms. When any of the open-ended terms is used, it means that additional elements may or may not be included in addition to elements. The term "consist of" is a closed-ended term. However, even when the closed-ended term is used, it does not mean that additional elements such as normally accompanying impurities and elements irrelevant to the technique of the present disclosure are excluded. The term "substantially consist of" is a semi-closed-ended term. When the semi-closed-ended term is used, it means that it is allowed to add elements that do not substantially affect the basic and novel characteristics of the technique of the present disclosure.

In this disclosure, the words such as "may" and "can" are used in a permissive sense, meaning that "there is a possibility," rather than in a mandatory sense, meaning "must."

In the present disclosure, the order in which a plurality of steps, actions, operations, etc. included in various methods is performed is not limited to the described order unless otherwise specified. For example, a plurality of steps may proceed in parallel. For example, the order of a plurality of steps may be reversed.

The geometric terms in the present disclosure (e.g., "parallel," "perpendicular," and "orthogonal") should not be interpreted in a strict sense. For example, the term "parallel" is not limited to parallel in a strict sense, and may also mean "close to parallel" or "substantially parallel". The geometric terms in the present disclosure can include, for example, design, operation, and manufacturing tolerances and variations. The dimensional relationship in each drawing may not match the actual dimensional relationship. In order to facilitate understanding of the technique of the present disclosure, the dimensional relationship (length, width, thickness, etc.) may be varied among the drawings. A part of the configurations may not be shown in the drawings.

In the present disclosure, the numerical ranges such as "m % to n %" include their upper and lower limit values unless otherwise specified. That is, "m % to n %" indicates the numerical range of "m % or more and n % or less." Further, "m % or more and n % or less" includes "more than m % and less than n %." A numerical value selected as desired from the numerical range may be set as a new upper limit value or a new lower limit value. For example, a new numerical range may be set by combining a numerical value in the numerical range and a numerical value shown in a different part of the present disclosure, in a table, in the drawing, etc.

In the present disclosure, all numerical values should be interpreted as having the term "about" in front of them. The term "about" can mean, for example, ±5%, ±3%, or ±1%. All numerical values can be approximate values that can vary depending on the manner in which the technique of the present disclosure is used. All numerical values can be expressed in significant figures. A measured value can be an average value of a plurality of measurements. The number of measurements may be three or more, five or more, or ten or more. It is generally expected that the larger the number of measurements, the higher the reliability of the average value. A measured value can be rounded based on the number of significant figures. A measured value can include an error etc. due to, for example, the detection limit of a measuring device.

In the present disclosure, the term "electric power storage device" signifies a device that can store electric power. The electric power storage device can include any secondary battery, primary battery, capacitor, etc. The electric power storage device may be, for example, a lithium-ion battery. The lithium-ion battery may be, for example, a liquid battery or an all-solid-state battery.

In the present disclosure, the term "electrode layer" is used as a general term for a positive electrode layer and a negative electrode layer. That is, the term "the electrode layer" can signify at least one of the positive electrode layer and the negative electrode layer.

In the present specification, the "state of charge (SOC)" is defined as the percentage of the remaining capacity to the full charge capacity.

Electric Power Storage Device

FIG. 1 is a schematic view showing an example of an electric power storage device according to the present embodiment. Hereinafter, the "electric power storage device according to the present embodiment" is sometimes simply referred to as the "device." The device 100 is a lithium-ion battery. The device 100 includes a case 90. The case 90 may have a rectangular parallelepiped shape, a cylindrical shape, or a flat shape. The case 90 may be, for example, a container made of metal or a pouch made of an aluminum laminated film. The case 90 is provided with a positive electrode terminal 91 and a negative electrode terminal 92. The case 90 houses an electrode assembly 50.

Figure 2:
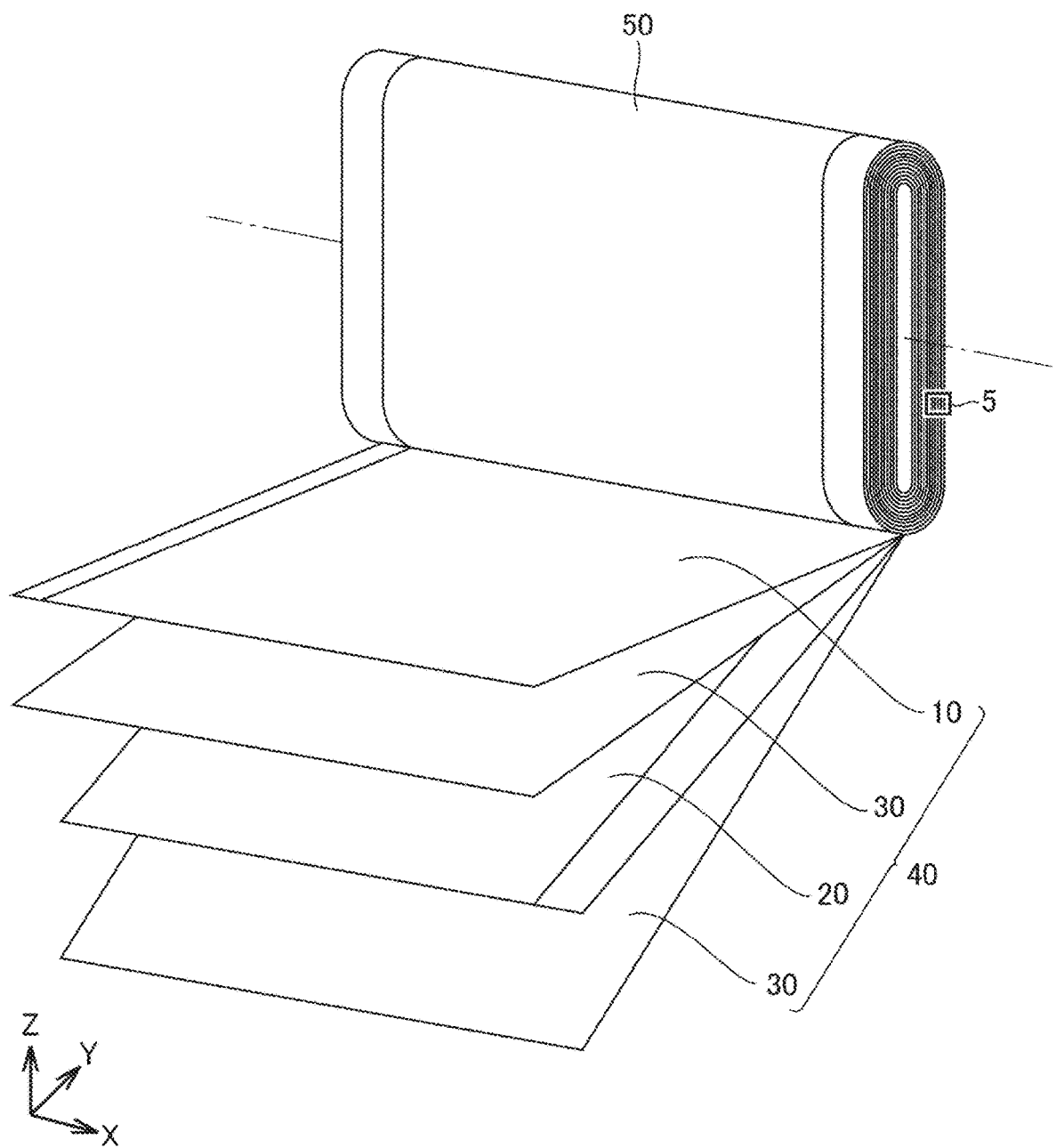
FIG. 2 is a schematic view showing an example of an electrode assembly.

FIG. 2 is a schematic view showing an example of the electrode assembly 50. The electrode assembly 50 is a wound electrode assembly. The electrode assembly 50 may be a stacked electrode assembly. The electrode assembly 50 includes a stack 40. The stack 40 is formed by stacking a positive electrode plate 10, a separator 30 (first separator), a negative electrode plate 20, and a separator 30 (second separator) in this order. The electrode assembly 50 is formed by winding the stack 40 in a spiral. The electrode assembly 50 includes a stacked portion 5. That is, the device 100 includes the stacked portion 5.

Figure 3:
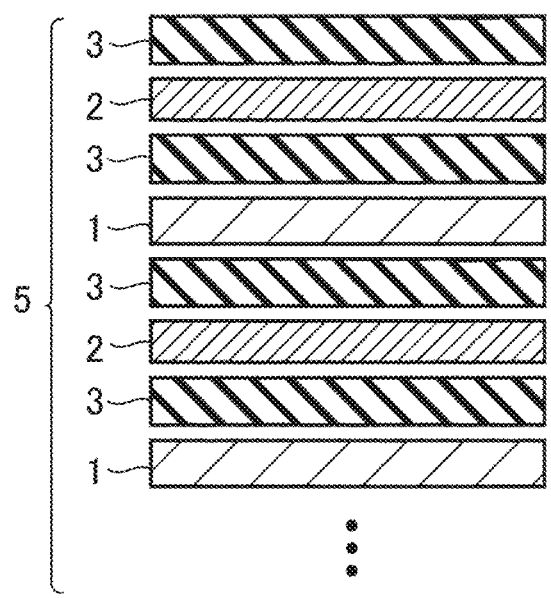
FIG. 3 is a schematic view showing an example of a stacked portion.

FIG. 3 is a schematic view showing an example of the stacked portion 5. In the stacked portion 5, positive electrode layers 1 and negative electrode layers 2 are alternately stacked such that a separator layer 3 is interposed between the positive electrode layer 1 and the negative electrode layer 2. In other words, the separator layer 3 and the electrode layer (positive electrode layer 1 or negative electrode layer 2) are alternately stacked.

In the wound electrode assembly 50, a single positive electrode plate 10 is wound around a winding axis to form a plurality of positive electrode layers 1 (see FIG. 2). That is, each positive electrode layer 1 is a part of the single positive electrode plate 10. Similarly, a single negative electrode plate 20 is wound around the winding axis to form a plurality of negative electrode layers 2. Each negative electrode layer 2 is a part of the single negative electrode plate 20. Two separators 30 are wound around the winding axis to form a plurality of (more than two) separator layers 3.

In the stacked electrode assembly, each positive electrode plate serves as a positive electrode layer. Similarly, each negative electrode plate serves as a negative electrode layer. Similarly, each separator serves as a separator layer.

When the device 100 is a liquid battery, the separator layers 3 may include, for example, a porous resin film. The separator layers 3 may include, for example, a polyolefin resin. When the device 100 is an all-solid-state battery, the separator layers 3 may include, for example, a sulfide solid electrolyte.

Method for Evaluating Electric Power Storage Device

Figure 4:
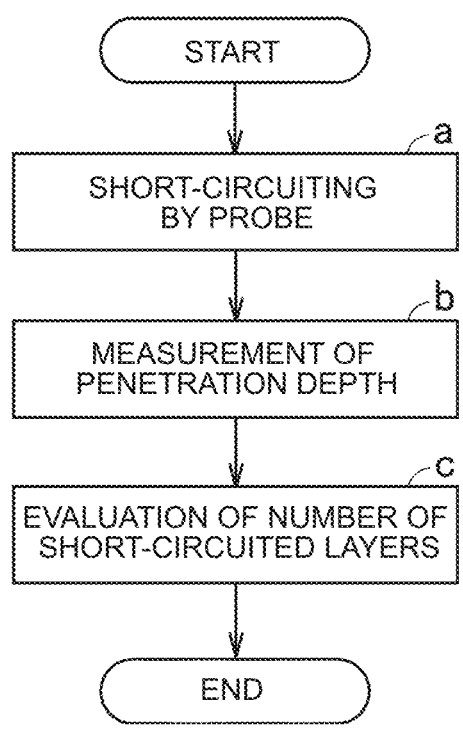
FIG. 4 is a schematic flowchart of a method for evaluating an electric power storage device according to the embodiment.

FIG. 4 is a schematic flowchart of a method for evaluating an electric power storage device according to the present embodiment. Hereinafter, the "method for evaluating an electric power storage device according to the present embodiment" is sometimes simply referred to as the "evaluation method." The evaluation method includes "(a) short-circuiting by a probe," "(b) measurement of penetration depth" and "(c) evaluation of number of short-circuited layers."

(a) Short-Circuiting by Probe

The evaluation method includes causing a short circuit by inserting an electrically conductive probe 9 into the stacked portion 5 in the thickness direction of the electrode layers. For example, the probe 9 may be inserted parallel to the thickness direction of the electrode layer.

Figure 5:
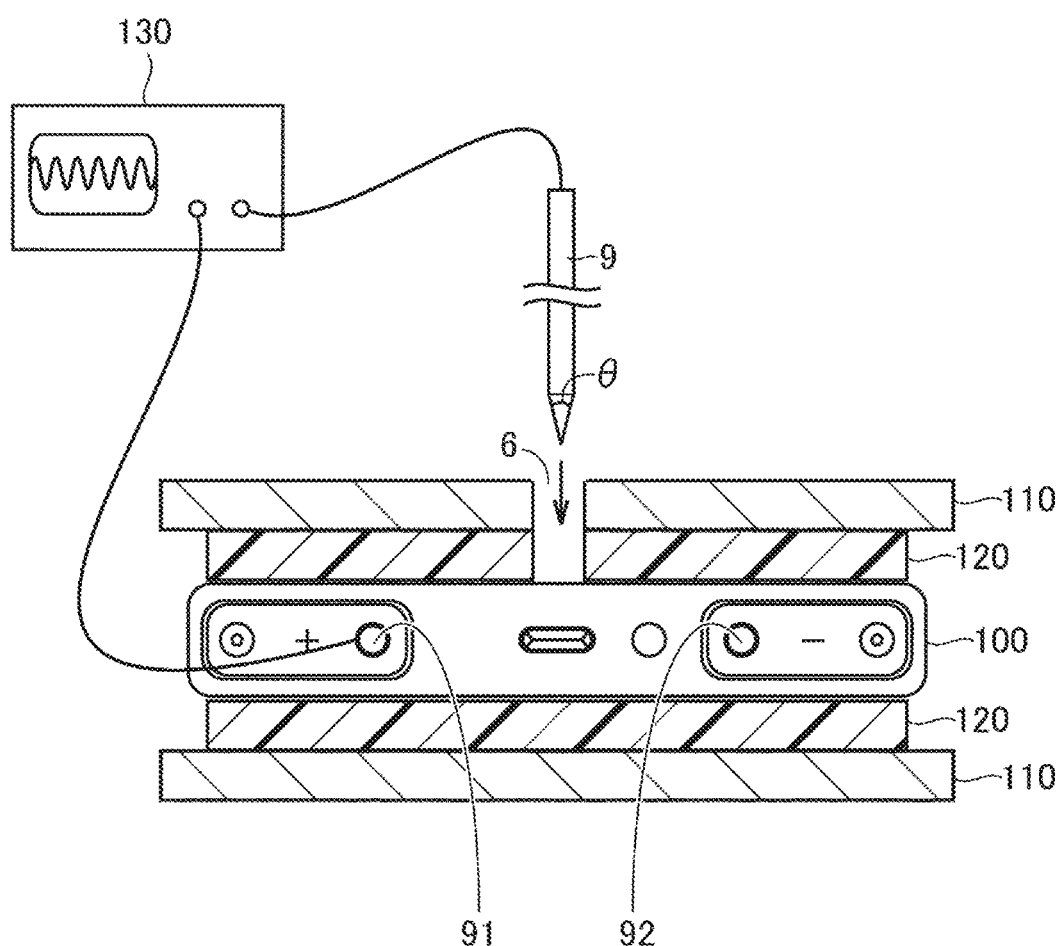
FIG. 5 is a schematic view illustrating a short-circuiting method.

FIG. 5 is a schematic view illustrating a short-circuiting method. The probe 9 is prepared. The probe 9 is electrically conductive. The probe 9 may be made of, for example, metal. The probe 9 may be made of, for example, iron (Fe) or stainless steel (SUS). The probe 9 may have a sharp tip. The probe 9 may have the shape of, for example, a nail. The tip angle θ of the probe 9 may be, for example, 10° to 90° or 30° to 45°. The diameter of the probe 9 may be, for example, 0.1 mm to 10 mm or 1 mm to 3 mm.

The device 100 is prepared. The SOC of the device 100 is adjusted. The SOC may be adjusted to, for example, 50% to 100% or 80% to 100%. The ambient temperature is set. The ambient temperature may be, for example, 10° C. to 80° C. or 20° C. to 60° C. For example, the ambient temperature can be controlled by performing the insertion of the probe 9 in a constant temperature bath.

For example, the device 100 is sandwiched between two restraining plates 110. The restraining plates 110 may be made of, for example, metal. An intermediate plate 120 may be interposed between each restraining plate 110 and the device 100. The intermediate plates 120 may be made of, for example, a resin. The intermediate plates 120 may be made of, for example, Bakelite. The device 100 is pressed by the restraining plates 110. The device 100 may be pressed with a pressing force of, for example, 1 kN to 10 kN. The stacked portion 5 can be restrained by restraining the device 100. As a result, it is expected that a change in distance between the electrodes will be small when the probe 9 is inserted. Since a change in distance between the electrodes is small, it is expected that, for example, a change in potential difference (see FIG. 6) will be stable.

One of the positive electrode terminal 91 and the negative electrode terminal 92 is selected as a reference. For example, the positive electrode terminal 91 may be selected. The selected electrode terminal is connected to a voltage measuring device 130. The probe 9 is connected to the voltage measuring device 130. That is, the potential difference between the positive electrode terminal 91 and the probe 9 is measured.

The probe 9 is driven by, for example, a servomotor. The speed at which the probe 9 is moved may be, for example, 0.001 mm/s to 1 mm/s or 0.01 mm/s to 0.1 mm/s. The restraining plate 110 and the intermediate plate 120 have a hole 6 for passing the probe 9 in their center. The probe 9 is stuck into the device 100 through the hole 6. The probe 9 penetrates the case 90 into the device 100. For example, when the case 90 is hard and it is difficult for the probe 9 to pass through the case 90, a hole for passing the probe 9 may be formed in advance in the case 90.

Figure 6:
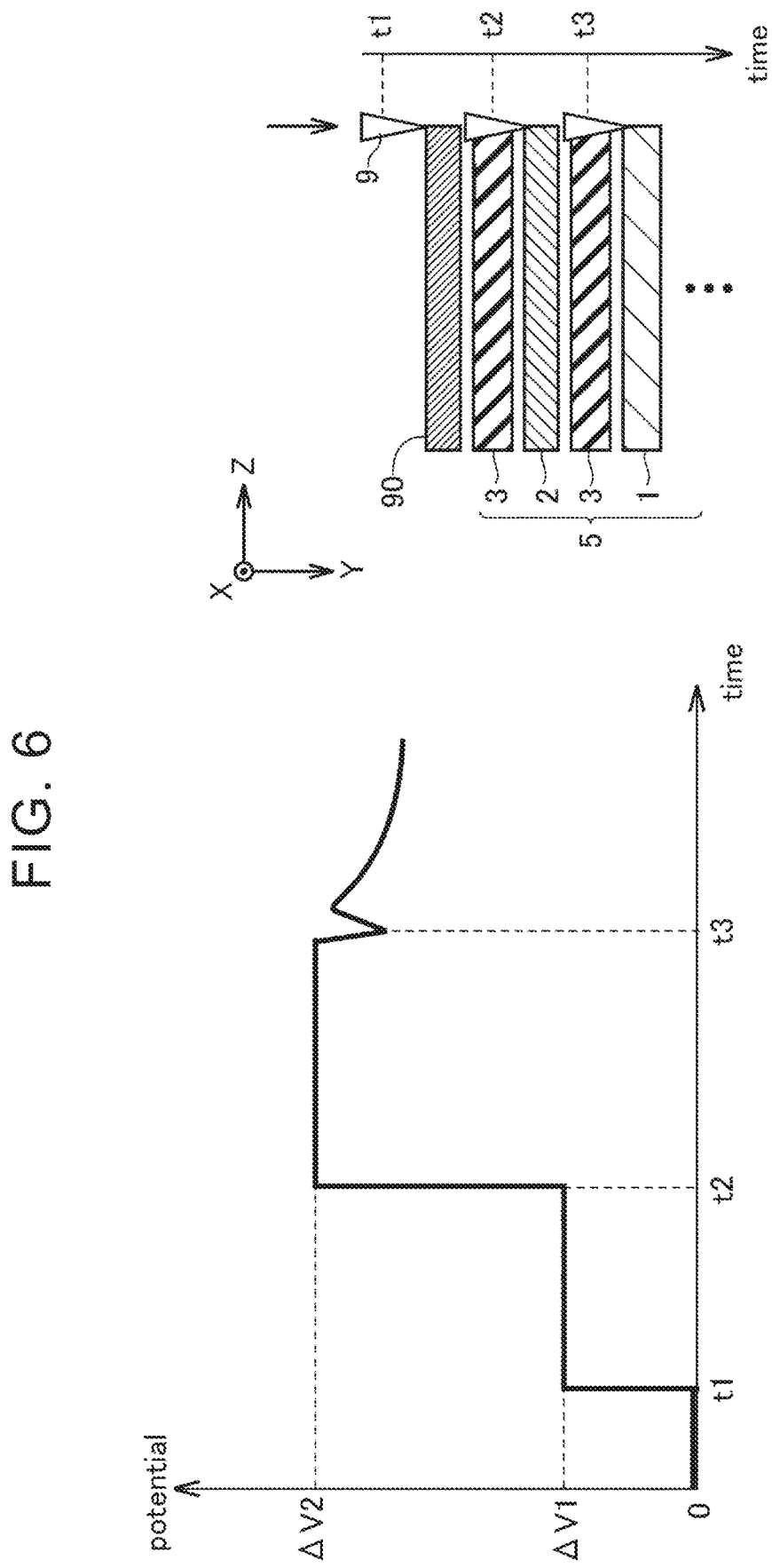
FIG. 6 is a schematic diagram showing an example of a change in potential difference.

FIG. 6 is a schematic diagram showing an example of a change in potential difference. The ordinate of the graph represents the potential difference between the positive electrode terminal 91 and the probe 9. The abscissa of the graph represents time. At first time t1, the probe 9 comes into contact with the case 90. A first potential difference ΔV1 at first time t1 corresponds to the potential difference between the positive electrode plate 10 and the case 90. The probe 9 passes through the case 90 into the stacked portion 5. At second time t2, the probe 9 passes through the outermost separator layer 3 and comes into contact with the negative electrode layer 2. A second potential difference ΔV2 at second time t2 corresponds to the potential difference between the positive electrode plate 10 and the negative electrode plate 20 (voltage between terminals). At third time t3, the probe 9 passes through the second outermost separator layer 3 and comes into contact with the positive electrode layer 1. As a result, a single-layer short circuit occurs. A spike-like change in potential difference appears due to the single-layer short circuit. The probe 9 can be stopped at third time t3.

At this time, for example, if the timing when the probe 9 is stopped is late (i.e., delayed), the probe 9 may pass through the positive electrode layer 1 and may come into contact with the second outermost negative electrode layer 2. That is, a short circuit that involves more electrode layers than in a single-layer short circuit may occur. Moreover, the change in potential difference may not be stable, and a single-layer short circuit (spike-like change) may be erroneously detected. Therefore, it is sometimes required to verify the actual number of short-circuited layers.

The state of the device 100 may be checked for a predetermined time after the probe 9 is stopped (after the short circuit occurs). The predetermined time may be, for example, one minute to three hours, or 30 minutes to one hour.

For example, at least one selected from the group consisting of the appearance, surface temperature, and voltage between terminals of the device 100 may be checked. The appearance can be checked visually. The appearance may be recorded as, for example, a video and images. For example, deformation, discoloration (change of color), cracking, liquid leakage, or smoking may occur regarding the appearance. The temperature can be measured by a temperature measuring device. For example, the heat distribution may be measured by thermography. The voltage between terminals can be measured by a voltmeter.

The change in potential difference shown in FIG. 6 is merely an example. For example, when the potential difference between the negative electrode terminal 92 and the probe 9 is measured, the change in potential difference is different from that shown in FIG. 6. The change in potential difference can also vary depending on the potential of the case 90.

(b) Measurement of Penetration Depth

The evaluation method includes measuring the penetration depth of the probe 9 after the short circuit occurs. The penetration depth can be identified by measuring the length of an adhesion portion. The adhesion portion signifies a portion of the surface of the probe 9 to which a constituent material of the stacked portion 5 adheres. The adhesion portion can be a portion to which at least one constituent material selected from the group consisting of, for example, constituent materials of the positive electrode layer 1, the negative electrode layer 2, and the separator layer 3 adheres.

An image of the probe 9 is acquired by observing the tip of the probe 9 with, for example, an optical microscope or a scanning electron microscope (SEM). The length of the adhesion portion can be measured in the image of the probe 9.

Figure 7:
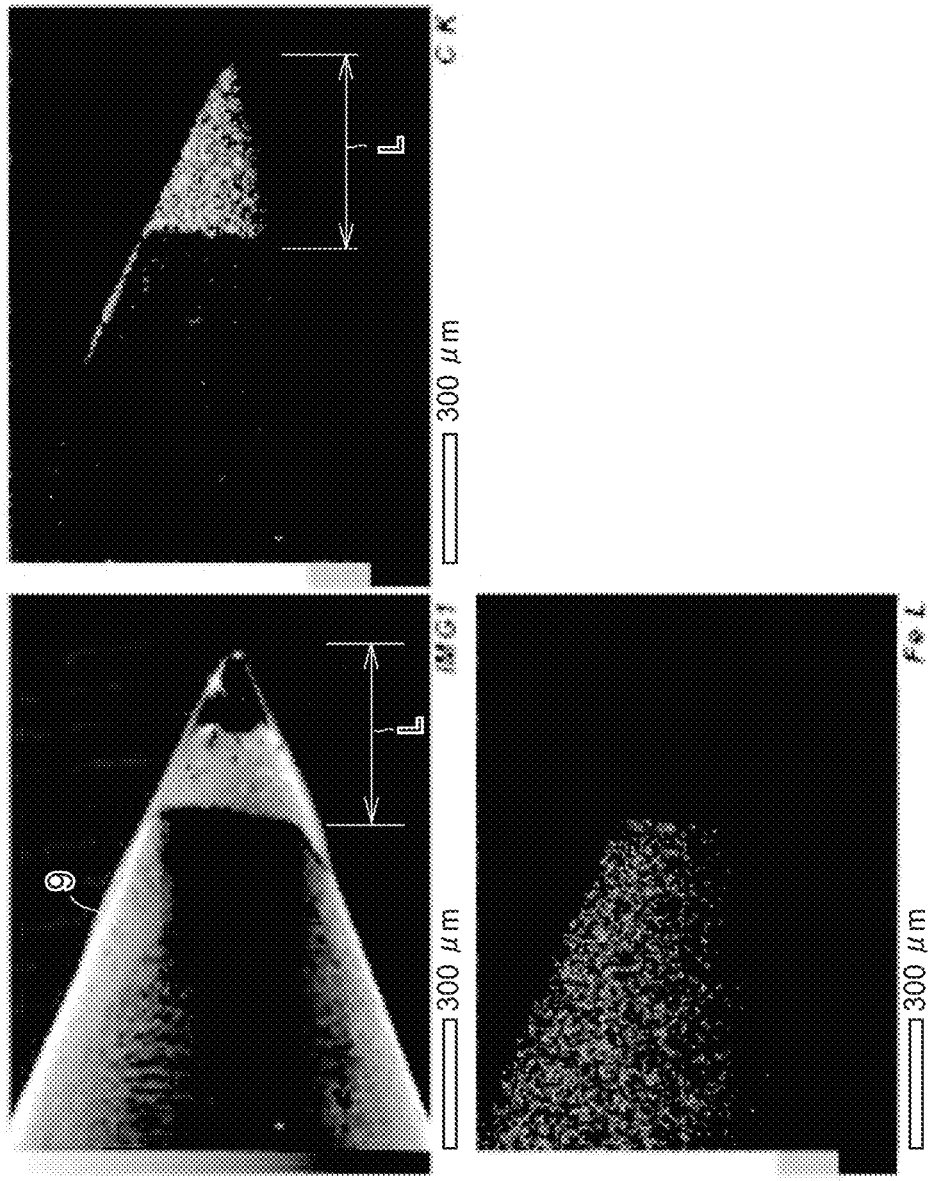
FIG. 7 shows a scanning electron microscope (SEM) image and elemental mapping images of the tip of a probe.

FIG. 7 shows an SEM image and elemental mapping images of the tip of the probe 9. In the example of FIG. 7, the probe 9 is made of Fe, and an adhering element is carbon (C). Carbon is considered to indicate the resin material included in the separator layer 3. The adhering element is a so-called marker. The length L of the adhesion portion can be clearly determined from the elemental mapping image of the adhering element (C). It is therefore considered that the length L of the adhesion portion can be measured with high accuracy.

The elemental mapping images can be acquired by, for example, energy dispersive X-ray spectroscopy (EDX) or an electron probe microanalyzer (EPMA). The elemental mapping images of FIG. 7 are images acquired by EDX.

Any element other than carbon may be used as a marker as long as it is a constituent material of the stacked portion 5. For example, a metal element contained in an active material may be used as a marker. For example, in an all-solid-state battery, a non-metal element (e.g., sulfur) contained in a solid electrolyte may be used as a marker.

(c) Evaluation of Number of Short-Circuited Layers

The evaluation method may include evaluating the number of electrode layers involved in the short circuit based on the penetration depth. For example, it may be determined that the number of electrode layers involved in the short circuit is two by comparing the thicknesses of the separator layer 3 and the electrode layers with the penetration depth. That is, establishment of a single-layer short circuit may be confirmed. When a single-layer short circuit is not established, the process of "(a) short-circuiting by probe" to "(c) evaluation of number of short-circuited layers" may be retried.

Figure 8:
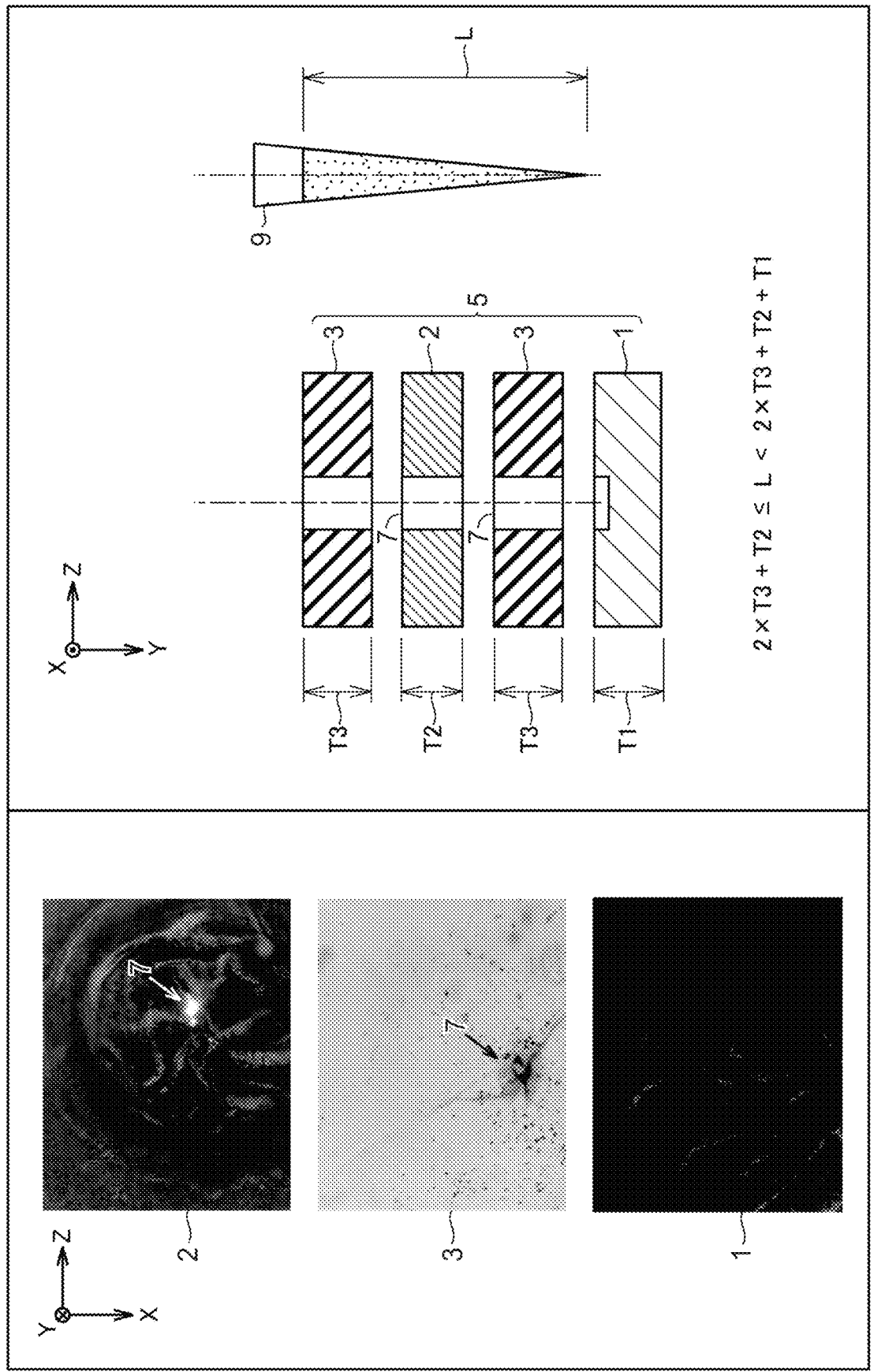
FIG. 8 shows an example of the examination results regarding a short-circuited portion.

FIG. 8 shows an example of the examination results regarding the short-circuited portion. The positive electrode layer 1 has a first thickness T1. The negative electrode layer 2 has a second thickness T2. The separator layer 3 has a third thickness T3. When the length L of the adhesion portion is smaller than the total thickness (2×T3+T1+T2), it is considered that a single-layer short circuit is established. For example, when the following expression (1) is satisfied for the stacked portion 5 of FIG. 8, it can be determined that a single-layer short circuit is established.

$$(2 \times T3 + T2) \leq L < (2 \times T3 + T1 + T2) \tag{1}$$

The total thickness (combination of thicknesses) to be compared with the length L can be changed as appropriate according to the structure of the stacked portion 5.

FIG. 8 shows microscopic images (top views) of the negative electrode layer 2 (second outermost layer), the separator layer 3 (third outermost layer), and the positive electrode layer 1 (fourth outermost layer). The negative electrode layer 2 has a through-hole 7. The separator layer 3 also has a through-hole 7. No through-hole is observed in the positive electrode layer 1. It is therefore considered that the probe 9 penetrated the positive electrode layer 1 but did not pass through the positive electrode layer 1. It is considered that the length L of the adhesion portion well matches the actual penetration depth.

Method for Manufacturing Electric Power Storage Device

Figure 9:
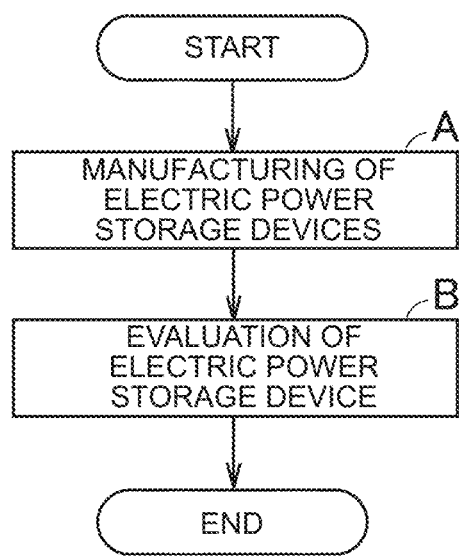
FIG. 9 is a schematic flowchart of a method for manufacturing an electric power storage device according to the embodiment.

FIG. 9 is a schematic flowchart of a method for manufacturing an electric power storage device according to the present embodiment. Hereinafter, the "method for manufacturing an electric power storage device according to the present embodiment" is sometimes simply referred to as the "manufacturing method." The manufacturing method includes "(A) manufacturing of electric power storage devices" and "(B) evaluation of electric power storage device(s)."

(A) Manufacturing of Electric Power Storage Devices

The manufacturing method includes manufacturing a plurality of devices 100. The devices 100 can be manufactured by a desired method. A plurality of devices 100 with the same specifications may be manufactured. A plurality of devices 100 with specifications different from each other may be manufactured.

(B) Evaluation of Electric Power Storage Device(s)

The manufacturing method includes evaluating one or more of the devices 100 by the evaluation method.

The evaluation method may be used for, for example, sampling inspection during manufacturing. For example, one or more devices 100 may be extracted from a specific production lot. Whether the production lot is acceptable may be determined based on the evaluation results regarding the one or more devices 100.

The evaluation method may be used to, for example, examine specifications during development. For example, a plurality of devices 100 with specific specifications may be manufactured. Whether the specifications are adopted may be determined based on the evaluation results regarding one or more of the devices 100.

The present embodiment is illustrative in all respects. The present embodiment is not restrictive. The technical scope of the present disclosure includes all modifications within the meaning and scope equivalent to the scope of claims described herein. For example, it is planned from the beginning that desired configurations are extracted from the present embodiment and combined as desired.

What is claimed is:

1. A method for evaluating an electric power storage device, the electric power storage device including a stacked portion, and separator layers and electrode layers being alternately stacked in the stacked portion, the method comprising:
    causing a short circuit by inserting an electrically conductive probe into the stacked portion in a thickness direction of the electrode layers;
    measuring a penetration depth of the probe after the short circuit occurs; and
    evaluating a number of the electrode layers involved in the short circuit based on the penetration depth, wherein
    the penetration depth is identified by measuring a length of an adhesion portion in an axial direction of the probe,
    the adhesion portion is a portion of a surface of the probe to which a constituent material of the stacked portion adheres, and
    evaluating the number of the electrode layers includes determining that the number of the electrode layers involved in the short circuit are two layers consisting of a single positive electrode layer and a single negative electrode layer by comparing a thickness of each of the separator layers and a thickness of each of the electrode layers with the penetration depth.

2. The method according to claim 1, wherein measuring the penetration depth of the probe includes measuring the length of the adhesion portion in an elemental mapping image of the probe.

3. The method according to claim 1, wherein the constituent material of the stacked portion is a resin material included in the separator layers.

4. A method for manufacturing an electric power storage device, the method comprising:
    manufacturing a plurality of electric power storage devices; and
    evaluating one or more of the electric power storage devices by the method according to claim 1.

5. The method according to claim 1, further comprising checking a state of the electric power storage device for a predetermined time after the probe is stopped due to the short circuit.

6. The method according to claim 1, wherein the constituent material includes one or more of the positive electrode layer, the negative electrode layer, and the separator layers.

7. The method according to claim 1, further comprising measuring a length of the adhesion portion based on acquiring an image of the probe.

8. The method according to claim 1, further comprising passing the probe in a center of a first restraining plate and an intermediate plate, wherein the electric power storage device is sandwiched between the first restraining plate and a second restraining plate, and wherein the intermediate plate is interposed between each of the first and second restraining plates.

* * * * *